United States Patent
Santin

(10) Patent No.: US 7,209,403 B2
(45) Date of Patent: Apr. 24, 2007

(54) ENHANCED FUSE CONFIGURATIONS FOR LOW-VOLTAGE FLASH MEMORIES

(75) Inventor: Giovanni Santin, Rieti (IT)

(73) Assignee: Micron Technology, Inc., Boise, ID (US)

( * ) Notice: Subject to any disclaimer, the term of this patent is extended or adjusted under 35 U.S.C. 154(b) by 497 days.

(21) Appl. No.: 10/716,766

(22) Filed: Nov. 19, 2003

(65) Prior Publication Data

US 2004/0100821 A1 May 27, 2004

Related U.S. Application Data

(62) Division of application No. 10/196,099, filed on Jul. 15, 2002, now Pat. No. 6,690,610, which is a division of application No. 09/651,472, filed on Aug. 30, 2000, now Pat. No. 6,426,910.

(51) Int. Cl.
*G11C 17/18* (2006.01)

(52) U.S. Cl. ............ 365/225.7; 365/189.09; 365/189.11; 365/189.05

(58) Field of Classification Search ........... 365/225.7, 365/185.33, 185.09, 185.05, 226, 189.05, 365/189.5, 189.11
See application file for complete search history.

(56) References Cited

U.S. PATENT DOCUMENTS

| | | | |
|---|---|---|---|
| 5,233,566 A | 8/1993 | Imamiya et al. ....... 365/230.08 |
| 5,299,166 A | 3/1994 | Suh et al. | |
| 5,315,177 A | 5/1994 | Zagar et al. ............. 307/465 |
| 5,452,251 A | 9/1995 | Akaogi et al. | |
| 5,602,777 A | 2/1997 | Nawaki et al. ........ 365/185.09 |
| 5,732,207 A | 3/1998 | Allen et al. ........... 395/182.03 |
| 5,852,580 A | 12/1998 | Ha ......................... 365/200 |
| 5,949,710 A | 9/1999 | Pass et al. ............. 365/185.05 |
| 5,959,909 A | 9/1999 | Peng et al. ............. 365/200 |
| 6,011,742 A | 1/2000 | Zheng ................... 365/225.7 |
| 6,081,911 A | 6/2000 | Pascucci .................. 714/718 |
| 6,088,281 A | 7/2000 | Miyakawa et al. | |
| 6,108,246 A | 8/2000 | Umezawa et al. | |
| 6,122,209 A | 9/2000 | Pass et al. .............. 365/201 |
| 6,134,177 A | 10/2000 | Kang | |
| 6,163,490 A | 12/2000 | Shaffer et al. ............ 365/200 |
| 6,246,615 B1 | 6/2001 | King et al. ............... 365/200 |
| 6,259,271 B1 | 7/2001 | Couts-Martin et al. ....... 326/40 |
| 6,320,428 B1 * | 11/2001 | Atsumi et al. .............. 327/78 |
| 6,426,910 B1 * | 7/2002 | Santin .................. 365/225.7 |

(Continued)

FOREIGN PATENT DOCUMENTS

EP        0881571        12/1998

(Continued)

*Primary Examiner*—Viet Q. Nguyen
(74) *Attorney, Agent, or Firm*—Schwegman, Lundberg, Woessner & Kluth, P.A.

(57) ABSTRACT

An enhanced fuse circuit is discussed that advances redundancy techniques in integrated circuits. The enhanced fuse circuit uses a single nonvolatile fuse and a latch that is coupled at a desired time. One embodiment of the invention discusses a fuse circuit that includes a volatile latch and a nonvolatile fuse. The nonvolatile fuse adapts to operate with a voltage supply greater than about 1.65 volts. The voltage supply is boosted at a desired time to a predetermined level and for a predetermined duration so that the nonvolatile fuse transfers its data to the volatile latch.

47 Claims, 6 Drawing Sheets

U.S. PATENT DOCUMENTS

| | | | |
|---|---|---|---|
| 6,430,101 B1 * | 8/2002 | Toda | 365/225.7 |
| 6,465,818 B1 * | 10/2002 | Kato | 257/207 |
| 6,466,482 B2 * | 10/2002 | Shukuri et al. | 365/185.24 |
| 6,529,407 B2 | 3/2003 | Shukuri | 365/185.07 |
| 6,690,610 B2 * | 2/2004 | Santin | 365/225.7 |
| 6,847,574 B2 * | 1/2005 | Santin | 365/225.7 |
| 6,877,100 B1 * | 4/2005 | Nobunaga et al. | 713/400 |
| 2002/0027813 A1 | 3/2002 | King et al. | 365/200 |
| 2002/0175742 A1 | 11/2002 | Santin | 327/525 |
| 2002/0181309 A1 | 12/2002 | Santin | 365/225.7 |

FOREIGN PATENT DOCUMENTS

| | | |
|---|---|---|
| JP | 05-218357 | 8/1993 |
| JP | 06-203590 | 7/1994 |
| JP | 11-126489 | 5/1999 |
| JP | 11-337350 | 12/1999 |
| JP | 2000-48593 | 2/2000 |
| JP | 2000-091505 | 3/2000 |

* cited by examiner

ENHANCED FUSE CONFIGURATIONS FOR LOW-VOLTAGE FLASH MEMORIES

This application is a Divisional of U.S. application Ser. No. 10/196,099, filed Jul. 15, 2002, now U.S. Pat. No. 6,690,610, which is a Divisional of U.S. application Ser. No. 09/651,472, filed Aug. 30, 2000, now U.S. Pat. No. 6,426,910, both of which are incorporated herein by reference.

TECHNICAL FIELD

The present invention relates generally to semiconductor integrated circuits. More particularly, it pertains to fuse configurations that are used in redundancy circuits in low-voltage flash memory devices.

BACKGROUND

Memory devices are integrated circuits in which information may be stored and from which information may be extracted when desired. Each memory device is built from a plurality of memory cells. Each memory cell memorizes a bit of data. Although a bit of data seems insignificant, it may determine whether the stored information is correct, such as an amount in a bank account.

A memory cell may become defective because of imperfect manufacturing practices or degradation over time. Such defects render the memory device inoperative or unreliable. Instead of ridding memory devices with defective memory cells, the semiconductor industry turns to various techniques to salvage these memory devices.

One technique employs redundancy circuits. Redundancy circuits include a number of nondefective memory cells that can replace defective memory cells in memory devices. Redundancy circuits do not physically replace the defective memory cells but logically replace them. Redundancy circuits detect whether defective memory cells exist, configure memory devices to avoid the defective memory cells, and redirect memory accesses from the defective memory cells to the nondefective memory cells.

The act of configuring uses fuse circuits, which include fuses that can be blown to support the act of configuring. Previous generations of fuse circuits are incompatible with the memory devices of today, which use voltage supplies as low as 1.65 volts. Certain previous generations of fuse circuits also tightly integrate fuses and latches. Such integration causes inflexibility that is undesirable.

Thus, what is needed are devices and methods to enhance fuse circuit configurations in low-voltage integrated circuits, such as flash memory devices.

SUMMARY OF THE INVENTION

The above mentioned problems with fuse circuits and other problems are addressed by the present invention and will be understood by reading and studying the following specification. Devices and methods are described which accord these benefits.

In one illustrative embodiment, a fuse circuit is discussed. The fuse circuit includes a volatile latch and a nonvolatile fuse that is receptive to a voltage supply of about 1.65 volts. The voltage supply is boosted at a desired time to a predetermined level and for a predetermined duration so that the nonvolatile fuse transfers its data to the volatile latch.

In another illustrative embodiment, a fuse circuit is discussed. The fuse circuit includes an input stage and a nonvolatile fuse having a first, a second, and a third connection. The first connection receives an enabling signal. The enabling signal can be boosted so that the nonvolatile fuse selective transfers its data. The input stage is receptive to an enabling signal.

In another illustrative embodiment, a fuse circuit is discussed. The fuse circuit includes an input stage that presents an inverted enabling signal, a boosting stage receptive to a boosting signal, and a nonvolatile fuse. The nonvolatile fuse has a first, a second, and a third connection. The first connection receives the inverted enabling signal. The inverted enabling signal is boosted by the boosting stage so that the nonvolatile fuse selectively transfers its data.

In another illustrative embodiment, a method is discussed for enhancing a fuse circuit in a low-voltage integrated circuit (IC). The method includes presenting by an input stage an inverted enabling signal, boosting by a boosting stage the inverted enabling signal, and transferring selectively by a nonvolatile fuse. The nonvolatile fuse has a first, a second, and a third connection. The first connection receives the inverted enabling signal that is boosted so that the nonvolatile fuse selectively transfers its data.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
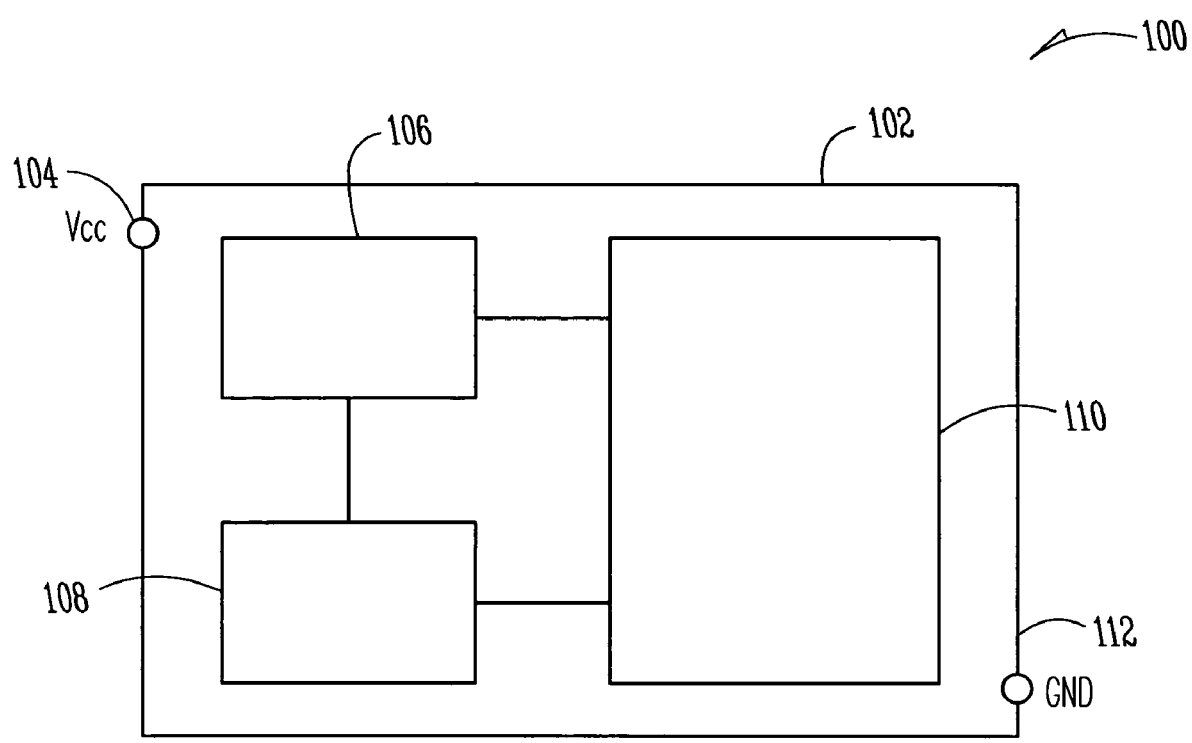
FIG. 1 is a block diagram according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The transistors described herein include transistors from bipolar-junction technology (BJT), field-effect technology (FET), or complementary metal-oxide-semiconductor (CMOS) technology. A metal-oxide-semiconductor (MOS) transistor includes a gate, a first node (drain) and a second node (source). Since a MOS is typically a symmetrical device, the true designation of "source" and "drain" is only possible once voltage is impressed on the terminals. The designations of source and drain herein should be interpreted, therefore, in the broadest sense.

The terms "high" and "low" as used herein refer to Vcc, the voltage supply, and ground, respectively. The term "external supply" as used herein refers to Vcc, the voltage supply. In one embodiment, the voltage supply supplies a voltage in the range of 1.65 to 2.22 volts, unless otherwise indicated.

The term "energy-storing device" described herein includes any devices capable of storing charges. The term "energy-storing device" includes a capacitor. The capacitor described herein can be any capacitor fabricated on an integrated circuit using any fabrication technique. The energy-storing device described herein, however, maybe fabricated as either an n-channel transistor or a p-channel transistor; the transistor's source and drain are connected together to form one conductive plate, its gate forms the other conductive plate, and the oxide layer forms the dielectric.

The term "pre-charging device" described herein includes any devices capable of providing charges to maintain a predetermined level of charges in an energy-storing device while a system that includes the energy-storing device is turned off. The reason for pre-charging is thus: the energy-storing device may have to store a large amount of charges to enable a circuit to provide a high-voltage signal. Without pre-charging, an undesired amount of time may have to be taken once the system is turned on to charge the energy-storing device. The pre-charging device described herein can be a square-law device. The pre-charging device described herein can be any transistor fabricated on an integrated circuit using any fabrication technique. The pre-charging device described herein, however, may be fabricated as an n-channel transistor with its drain and gate connected together; the drain is connected to an external supply.

The term "charging device" described herein includes any devices capable of charging an energy-storing device up to the level of the external supply. The purpose of the charging device is to charge the energy-storing device to compensate for any level degradation that may occur from the pre-charging process. The charging device described herein can be any transistor fabricated on an integrated circuit using any fabrication technique. The charging device described herein, however, may be fabricated as an n-channel transistor. This transistor may be configured with its drain connected to an external supply.

The embodiments of the invention focus on a fuse circuit that is employed in redundancy circuits. The fuse circuit of the embodiments of the invention uses memory cells as fuses. This is advantageous because memory cells are basically transistors that can be controlled. This ability to control the memory cells as fuses to set or to unset the fusing state is not possible with traditional fuses. Once a state of a traditional fuse is set, such as by blowing or melting, the state of the traditional fuse cannot be reversed.

Additionally, the memory cells can be used as trimming elements. Trimming elements fine-tune a configuration of integrated circuits, such as flash memory devices. Again, the process of fine-tuning an integrated circuit can be reversed with the memory cells as trimming elements.

Integrated circuits, such as flash memory devices, have progressed from being included in personal computers to handheld products, such as wireless phones. The marketplace values handheld products that are based on low-voltage integrated circuits, such as flash memory devices, because such products use less power and therefore last longer. Handheld products need to store information, and low-voltage flash memory is chosen as a storage medium. Low-voltage flash memory uses voltage supplies as low as 1.65 volts. Previous generations of fuse circuits rely on voltage supplies that provide high voltages. Thus, they are incompatible with low-voltage integrated circuits. In the discussion below, the embodiments of the invention solve these and other problems.

FIG. 1 is a block diagram of a system according to one embodiment of the invention. An integrated circuit 100 illustrates a portion of a low-voltage flash memory device 102. The low-voltage flash memory device 102 includes a voltage supply 104 and ground 112. The voltage supply 104 provides voltages as low as about 1.65 volts and as high as about 2.2 volts. This range of voltages is less than voltages used in previous generations of flash memory devices. The voltage supply 104 provides power to circuits within the portion of the low-voltage flash memory device 102.

The low-voltage flash memory device 102 includes a decoder 106. The decoder 106 receives address signals from another integrated circuit, such as a central processing unit, that wants to access the low-voltage flash memory device 102. The decoder 106 decodes the address signals into an access signal that can select a memory cell or a group of memory cells so as to retrieve or store desired information.

The low-voltage flash memory device 102 includes an array 110. The array 110 houses a plurality of memory cells. Each of the plurality of memory cells is selectable by the decoder 106. The array 110 typically arranges the memory cells into rows and columns. To select a memory cell in the array 110, the decoder provides a specific row and a specific column. In the idioms of computer architecture, the row is called a word line and the column is called a bit line.

The low-voltage flash memory device 102 includes a redundancy circuit 108. The redundancy circuit 108 is modified by at least one embodiment of the invention to work with low voltages provided by the voltage supply 104. The redundancy circuit 108 provides redundant memory elements that can logically replace defective memory elements in the array 110.

Figure 2:
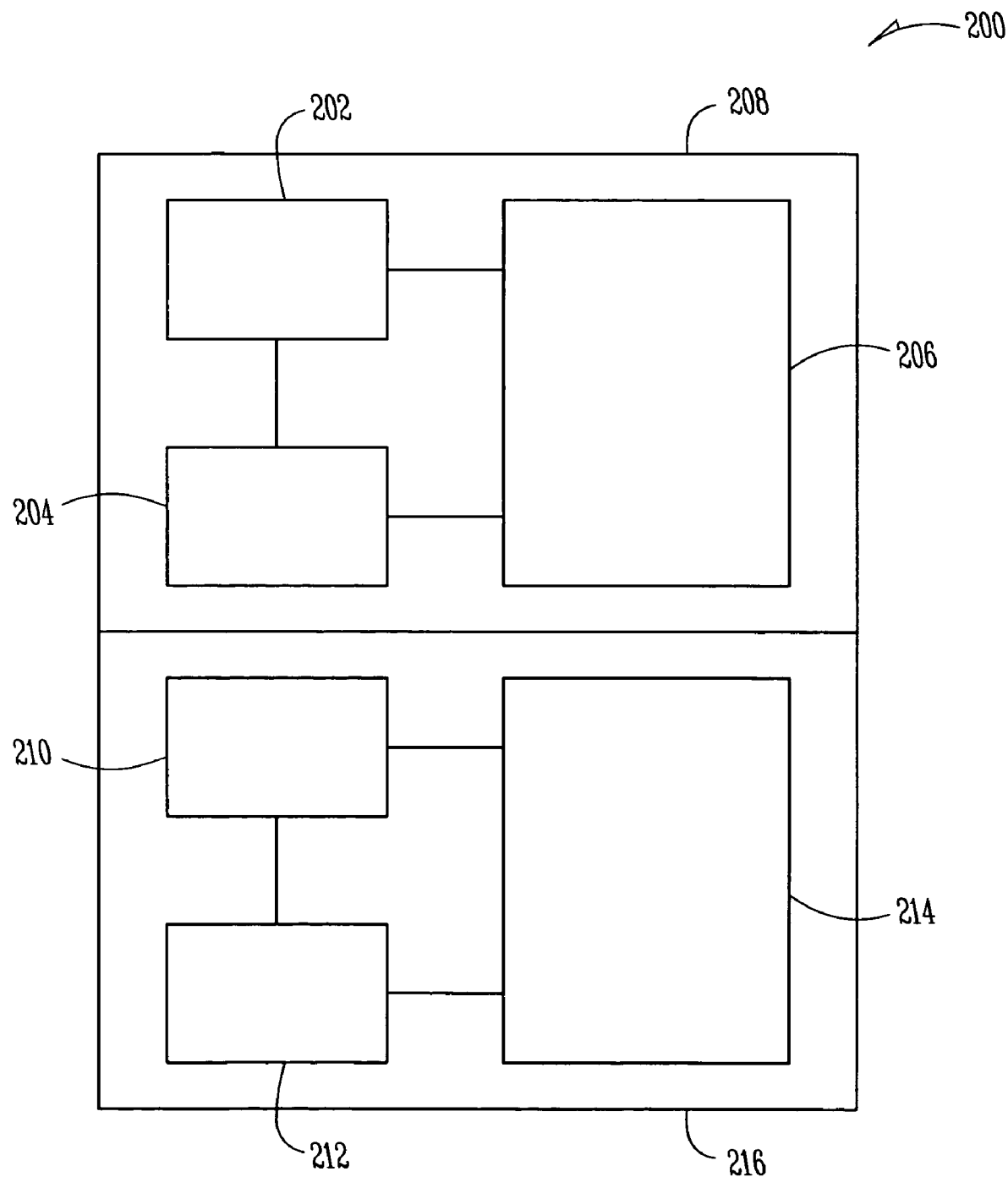
FIG. 2 is a block diagram according to an embodiment of the invention.

FIG. 2 is a block diagram of a redundancy circuit according to one embodiment of the invention. A redundancy circuit 200 includes a portion of a row fuse bank 208 and a column fuse bank 216. The row fuse bank 208 provides logical replacement for defective memory cells along a row of an array. The row fuse bank 208 includes a fuse circuit 204. The fuse circuit 204 includes the fuses and other elements that may provide the configuration needed to logically replace memory cells along a row of an array. The fuse circuit 204 includes various modifications provided by at least one embodiment of the invention.

The row fuse bank 208 includes a match circuit 206. The match circuit 206 includes a group of logic devices. This group of logic devices act together to emulate a logic function that produces a row match signal. This row match signal reflects whether a row in the array should be replaced because it contains at least one defective memory cell.

The row fuse bank 208 includes a disable circuit 202. A possibility exists that the fuse circuit 204 may include fuses that are defective. The disable circuit 202 disables the fuse circuit 204 if it detects that the fuse circuit 204 is unreliable.

The redundancy circuit 200 includes the column fuse bank 216. The column fuse bank 216 includes circuitry that is common to circuitry in the row fuse bank 208. The column fuse bank 216 provides logical replacement for defective memory cells along a column of an array. The column fuse bank 216 includes a fuse circuit 212. The fuse circuit 212 includes the fuses and other elements that may provide the configuration needed to logically replace memory cells along a column of an array. The fuse circuit 212 includes various modifications provided by at least one embodiment of the invention.

The column fuse bank 216 includes a match circuit 214. The match circuit 214 includes a group of logic devices. This group of logic devices act together to emulate a logic function that produces a column match signal. This column match signal reflects whether a column in the array should be replaced because it contains at least one defective memory cell.

The column fuse bank 216 includes a disable circuit 210. A possibility exists that the fuse circuit 212 may include fuses that are defective. The disable circuit 210 disables the fuse circuit 212 if it detects that the fuse circuit 212 is unreliable.

Figure 3:
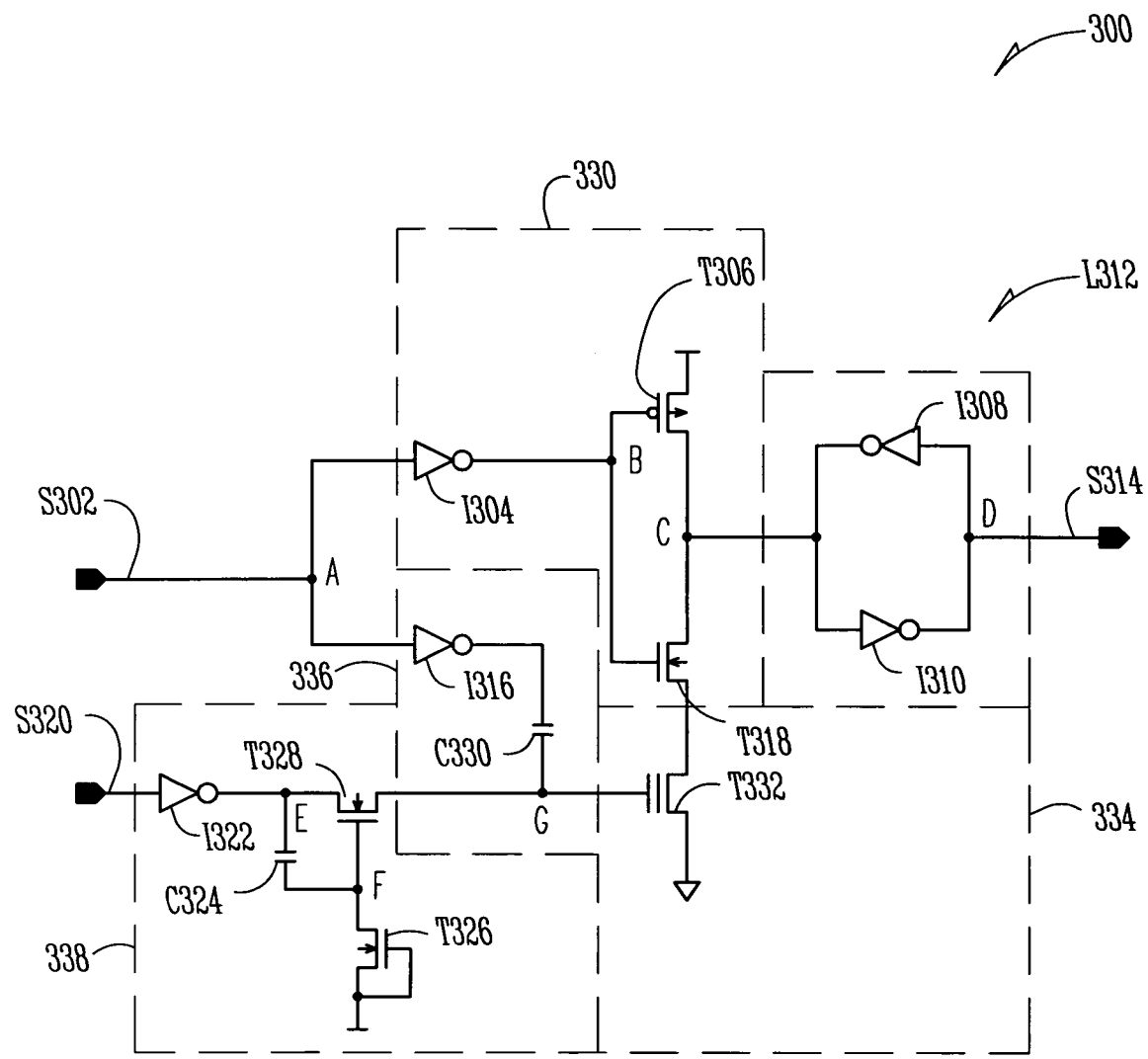
FIG. 3 is a circuit diagram according to an embodiment of the invention.

FIG. 3 is a circuit diagram according to one embodiment of the invention. A fuse circuit 300 includes a transferring stage 330. One purpose of the transferring stage 330 includes transferring the state of the fuse to another circuit. This serves to partially decouple the fuse from another circuit. The transferring stage 330 receives a transferring signal S302 and presents the transferring signal S302 at node A. The transferring stage 330 includes an inverter I304. The inverter I304 receives the transferring signal S302, produces an inverted transferring signal, and presents the inverted transferring signal to a node B.

The transferring stage 330 includes a p-channel transistor T306 having a gate, a drain, and a source. The gate of the p-channel transistor T306 couples to the node B. The source of the p-channel transistor T306 couples to a supply voltage. The drain of the p-channel transistor T306 couples to a node C.

The transferring stage 330 includes an n-channel transistor T318 having a gate, a drain, and a source. The gate of the n-channel transistor T318 couples to the node B. The drain of the n-channel transistor T318 couples to the node C. The source of the n-channel transistor T318 couples to the nonvolatile fuse 334, which will be discussed.

The fuse circuit 300 includes a latch L312. One purpose of the latch is to memorize the state of the fuse until the latch is notified otherwise. In one embodiment, the latch L312 is a volatile latch. In another embodiment, the latch L312 includes an inverter I308 having an input connection and an output connection. The input connection of the inverter I308 couples to a node D, and the output connection of the inverter I308 couples to the node C. The latch L312 also includes another inverter I310 having an input connection and an output connection. The input connection of the inverter I310 couples to the node C, and the output connection of the inverter I310 couples to the node D.

The fuse circuit 300 produces the signal S314 and presents the signal at the node D. This signal S314 reflects the state of the fuse of the fuse circuit 300.

The fuse circuit 300 includes a boosting stage 336. The boosting stage 336 boosts the voltage supply at a desired time to a predetermined level and for a predetermined duration. The boosting stage 336 includes an inverter I316 having an input connection and an output connection. The input connection of the inverter I316 couples to the node A, and therefore, is receptive to the transferring signal S302. The output connection of the inverter I316 presents a boosting signal.

The boosting stage 336 includes an energy-storing device C330 having a first connection and a second connection. In one embodiment the energy-storing device C330 is a capacitor with a value of about 10 picofarads. The first connection of the energy-storing device C330 receives the boosting signal from the inverter I316. The second connection of the energy-storing device C330 couples to a node G.

The fuse circuit 300 includes a nonvolatile fuse 334 having a first, a second, and a third connection. The first connection of the nonvolatile fuse 334 couples to the node G. The second connection of the nonvolatile fuse 334 couples to the source of the n-channel transistor T318 of the transferring stage 330. The third connection of the nonvolatile fuse 334 couples to ground.

In one embodiment, the nonvolatile fuse 334 is a flash cell T332 having a gate, a drain, and a source. The gate of the flash cell T332 couples to the node G. The drain of the flash cell T332 couples to the source of the n-channel transistor T318 of the transferring stage 330. The source of the flash cell T332 couples to ground. In one embodiment, the threshold voltage of the flash cell is greater than about 2.5 volts and less than about 3.5 volts. In one embodiment, the flash cell T332 refrains from transferring its data to the latch L312 when the flash cell T332 is in a programmed state if the gating signal at the gate of the flash cell is sufficiently high. In another embodiment, the flash cell T332 transfers its data when the nonvolatile fuse is in an erased state if the gating signal at the gate of the flash cell T332 is sufficiently high.

The fuse circuit 300 includes an input stage 338. The input stage 338 receives an enabling signal S320, and presents the enabling signal S320 to an inverter I322. The inverter I322 includes an input connection and an output connection. The input connection of the inverter I322 receives the enabling signal S320, and the output connection of the inverter I322 presents a gating signal at a node E.

Also coupled to the node E is an n-channel transistor T328 having a gate, a drain, and a source. In one embodiment, the n-channel transistor T328 includes a threshold voltage that is less than 1 volt. The gate of the n-channel transistor T328 couples to the node F. The drain of the n-channel transistor T328 couples to the node E. The source of the n-channel transistor T328 couples to the node G. The n-channel transistor T328 receives the gating signal at the drain, and presents the gating signal at the node G if the n-channel transistor is turned on.

The input stage 338 includes a pre-charging device T326. In one embodiment, the pre-charging device T326 is an n-channel transistor having a gate, a drain, and a source. The gate of the pre-charging device T326 couples to the drain and the drain of the pre-charging device T326 couples to the voltage supply. The source of the pre-charging device T326 couples to the node F.

The input stage 338 includes an energy-storing device C324 having a first connection and a second connection. In one embodiment, the energy-storing device C324 includes a capacitor with a value of about 0.1 picofarad. The first connection of the energy-storing device C324 couples to the node E. The second connection of the energy-storing device C324 couples to the node F.

The pre-charging device T326 pre-charges the energy-storing device C324. Current flows from the voltage supply, through the drain of the pre-charging device T326, through the source of the pre-charging device T326, and enters the energy-storing device C324 at the node F. Because a certain amount of charge is diverted to the gate of the pre-charging device T326 to turn on the pre-charging device T326, the pre-charged charges at the energy-storing device C324 are equivalent to the difference between the voltage supply and the threshold voltage of the pre-charging device T326.

The purpose of pre-charging the energy-storing device C324 is to boost any signal that is presented at the node E, so that the n-channel transistor T328 presents the signal at the node G without degradation. For example, suppose the inverter I322 presents a gating signal at the node E. Without the pre-charged energy-storing device C324, the n-channel transistor T328 presents the gating signal at the node G at a voltage level that is less than the voltage level of the gating signal presented at the node E. The difference in the voltage level is approximately the threshold voltage of the n-channel transistor T328.

The operation of the fuse circuit 300 progresses over at least three phases. In the first phase, at power up, the transferring signal S302 and the enabling signal S320 is at a high level. Because the transferring signal S302 is at a high level, the node A is at a high level. The inverter I304 inverts the transferring signal S302 and presents a switching signal at a low level at the node B. The switching signal, at the low level, turns on the p-channel transistor T306 and turns off the n-channel transistor T318. The turned-on p-channel transistor T306 switches the node C to the voltage supply, so that the node C is at a high level. The inverter I310 inverts the voltage at the node C, which is at a high level, to produce the signal S314 at a low level.

Returning to node A, which is at a high level, the inverter I316 inverts the voltage at the node A and presents a boosting signal at a low level. Turning now to node E, the inverter I322 inverts the enabling signal S320, which is at a high level, to present a gating signal at a low level to the node E. The n-channel transistor T328 presents the gating signal at the low level to the node G. Because both the boosting signal and the voltage at the node G is low, the energy-storing device C330 does not charge up. Additionally, the voltage at the node G is too low to turn on the nonvolatile fuse 334.

In the second phase, the transferring signal S302 remains at a high level, but the enabling signal S320 changes to a low level. With the transferring signal S302 at a high level, the transferring stage and the latch L312 maintain the same state as discussed hereinbefore. Thus, the latch L312 couples to the voltage supply, and continues to present the signal S314 at a low level. The boosting signal remains at a low level.

With the enabling signal S320 now at a low level, the inverter I322 presents the gating signal at a high level at the node E. The energy-storing device C324 boosts the gating signal even higher. The n-channel transistor T328 presents the gating signal at approximately the level of the voltage supply at the node G. The current of the gating signal flows to the energy-storing device C330, and over time charges the energy-storing device C330 up to the level of the gating signal, which is about the level of the voltage supply. The voltage of the gating signal at the node G at this point is still insufficient to turn on the nonvolatile fuse 334.

In the third phase, the transferring signal S302 changes to the low level while the enabling signal S320 remains at the low level. The transferring signal S302 is presented at the node A at the low level. The inverter I304 inverts the transferring signal S302 and presents a switching signal at a high level at the node B. The switching signal, which is at a high level, turns off the p-channel transistor T306 and turns on the n-channel transistor T318. The turned-off p-channel transistor switches the node C from the voltage supply. The turned-on n-channel transistor T318 switches the node C to the nonvolatile fuse 334.

Returning to the node A, the inverter I316 receives the transferring signal, which is at a high level, and presents the boosting signal at a high level to the energy-storing device C330. Recall that the energy-storing device C330 is already charged to a high level. The presence of the boosting signal at the high level boosts the amount of charges stored in the energy-storing device C330 to an even higher level. This boosted amount of charges is equivalent to twice the level of the gating signal at the node G. This level of the gating signal is greater than the threshold voltage of the nonvolatile fuse 334 and is sufficient to turn on the nonvolatile fuse 334. In one embodiment, the threshold voltage of the nonvolatile fuse 334 is greater than about 2.5 volts and less than about 3.5 volts.

The boosted gating signal at the node G will decay over time. The charges that are stored in the energy-storing device C330 escape through the source of the n-channel transistor T328 to enter the substrate of the n-channel transistor T328. However, the gating signal is boosted for a sufficient duration so that the nonvolatile fuse 334 selectively transfers its data to the latch L312.

In the embodiment in which the nonvolatile fuse 334 is a flash cell, the nonvolatile fuse 334 pulls the node C to ground if the nonvolatile fuse is in an erased state. With the voltage at the node C at a low level, the inverter I310 presents the signal S314 at a high level. If the nonvolatile fuse 334 is in a programmed state, the boosted gating signal is still insufficient to turn on the nonvolatile fuse 334. Thus, the node C is not coupled to the voltage supply or to ground. However, the latch L312 remembers the previous voltage level at the node C, which was high, and continues to produce a signal S314 at a low level.

FIGS. 4A–4E are timing diagrams according to one embodiment of the invention. These timing diagrams reflect voltages of various signals, nodes, and components of the fuse circuit 300 as discussed hereinbefore. The abscissa of each of the timing diagrams represents time. Each tick (major and minor) of the abscissa is spaced 25 nanoseconds apart. The ordinate of each of the timing diagram represents voltages. Each tick of the ordinate is spaced 500 millivolts apart. The units and the increments of the units used in the abscissa and the ordinate are for illustrative purposes only—they should not be interpreted as limitations upon the embodiments of the invention. The transitions of the waveforms of the timing diagrams are also for illustrative purposes only—they should not be interpreted as limitations upon the embodiments of the invention.

In various embodiments discussed above, the boosting stage is used to boost the gating signal to a level to turn on the nonvolatile fuse 334. In another embodiment, the boosting stage is replaced with a signal elsewhere to boost the gating signal; that signal may come from a charge-pump circuit, for example.

Figure 4A:
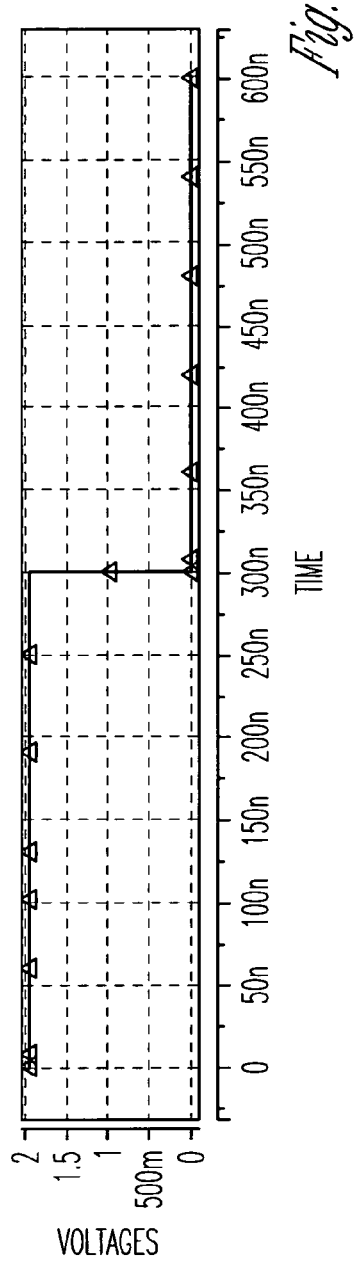
FIGS. 4A–4E are timing diagrams according to an embodiment of the invention.

FIG. 4A illustrates a timing diagram for the transferring signal S302. At 0 nanoseconds (at power up), the transferring signal S302 is high. The transferring signal S302 remains high until 300 nanoseconds elapse at which time the transferring signal S302 changes to low. The transferring signal S302 then remains low.

Figure 4B:
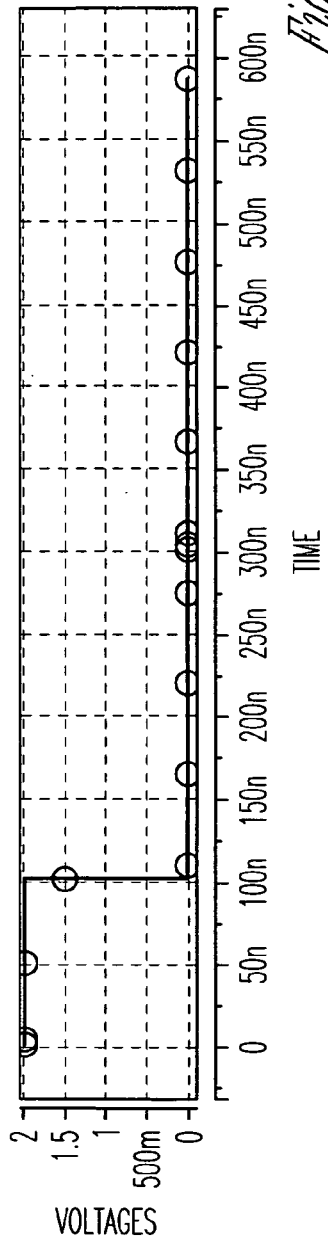

FIG. 4B illustrates a timing diagram for the enabling signal S320. The enabling signal S320 is initially high at 0 nanoseconds (at power up). The enabling signal S320 remains high until 100 nanoseconds elapse at which time the enabling signal changes to low. The enabling signal S320 then remains low.

Figure 4C:
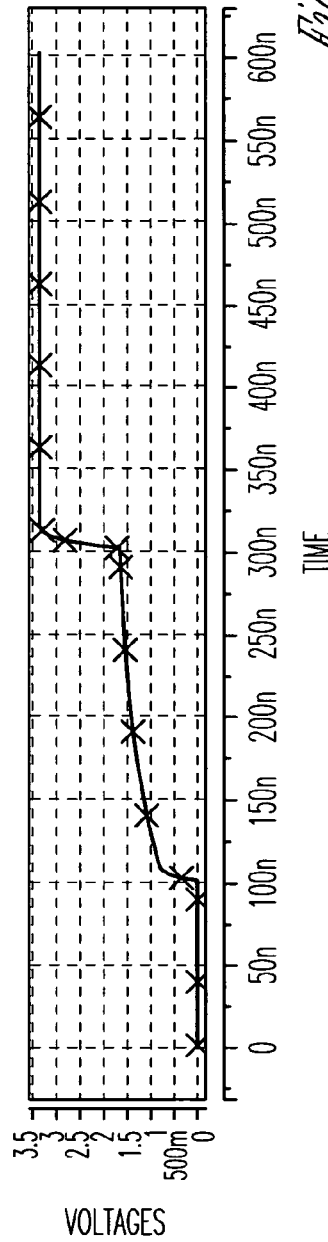

FIG. 4C illustrates a timing diagram for the gating signal at the node G. The gating signal is at a low level from 0 nanoseconds to 100 nanoseconds because the energy-storing device C330 has not charged up. When the enabling signal S320 changes to low at 100 nanoseconds, the gating signal at the node G begins to rise because the energy-storing device C330 is now charging up. The gating signal continues to rise until, at 300 nanoseconds, the gating signal reaches a certain voltage level. Also at 300 nanoseconds, the transferring signal S302 drops to a low voltage level. In turn, the gating signal is boosted to a higher voltage level. The gating signal then remains at the higher voltage level.

Figure 4D:
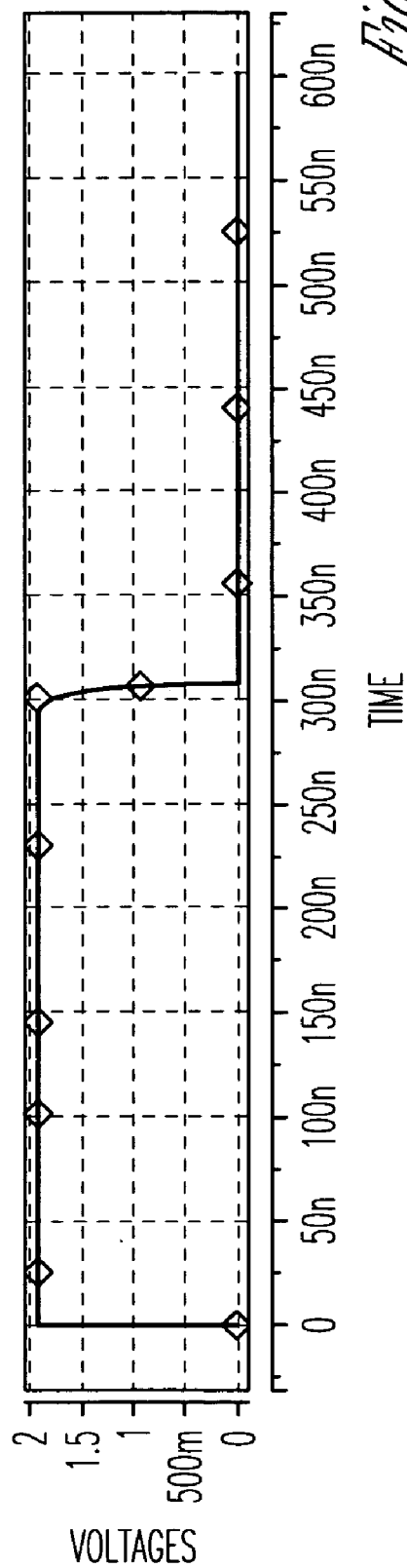

FIG. 4D illustrates a timing diagram for the voltage level at the node C. At 0 nanoseconds (at power up), the voltage level at the node C pulls up to the voltage supply as discussed hereinbefore. When the transferring signal S302 changes to a low level at about 300 nanoseconds, the voltage level at the node C switches to ground if the nonvolatile fuse 334 is turned on. Hence, the voltage at the node C is low.

Figure 4E:
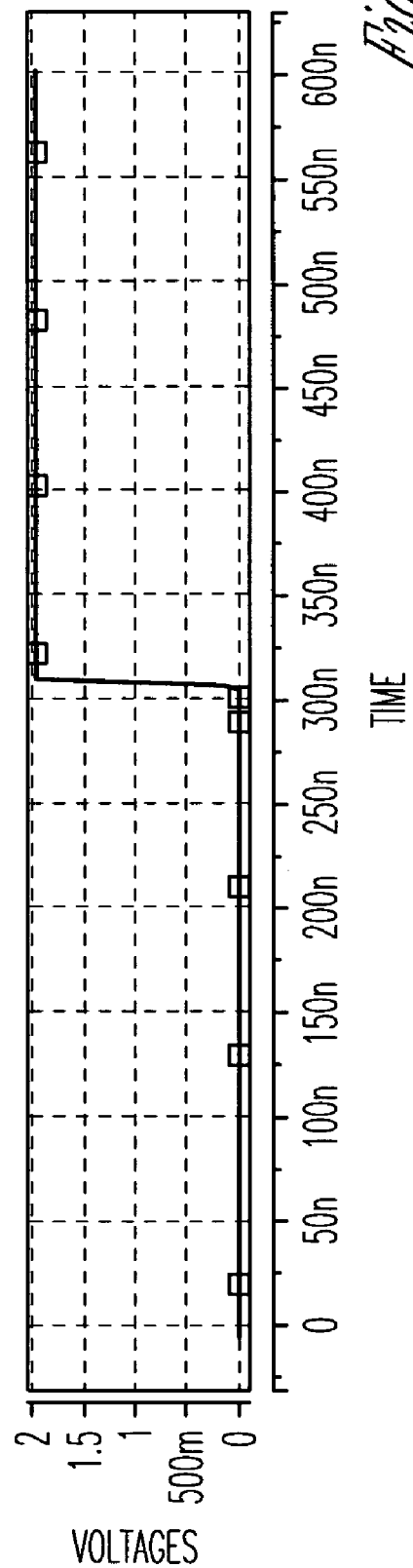

FIG. 4E illustrates a timing diagram for the voltage level at the node D. The timing diagram also reflects the voltage level of the signal S314. The waveform of the timing diagram of the FIG. 4E is an inversion of the waveform of the timing diagram of the FIG. 4D due to the inverter 310. Thus, from 0 nanoseconds to 300 nanoseconds, the voltage level of the signal S314 is low. Afterward, the timing diagram shows the voltage level of the signal S314 is high.

Figure 5:
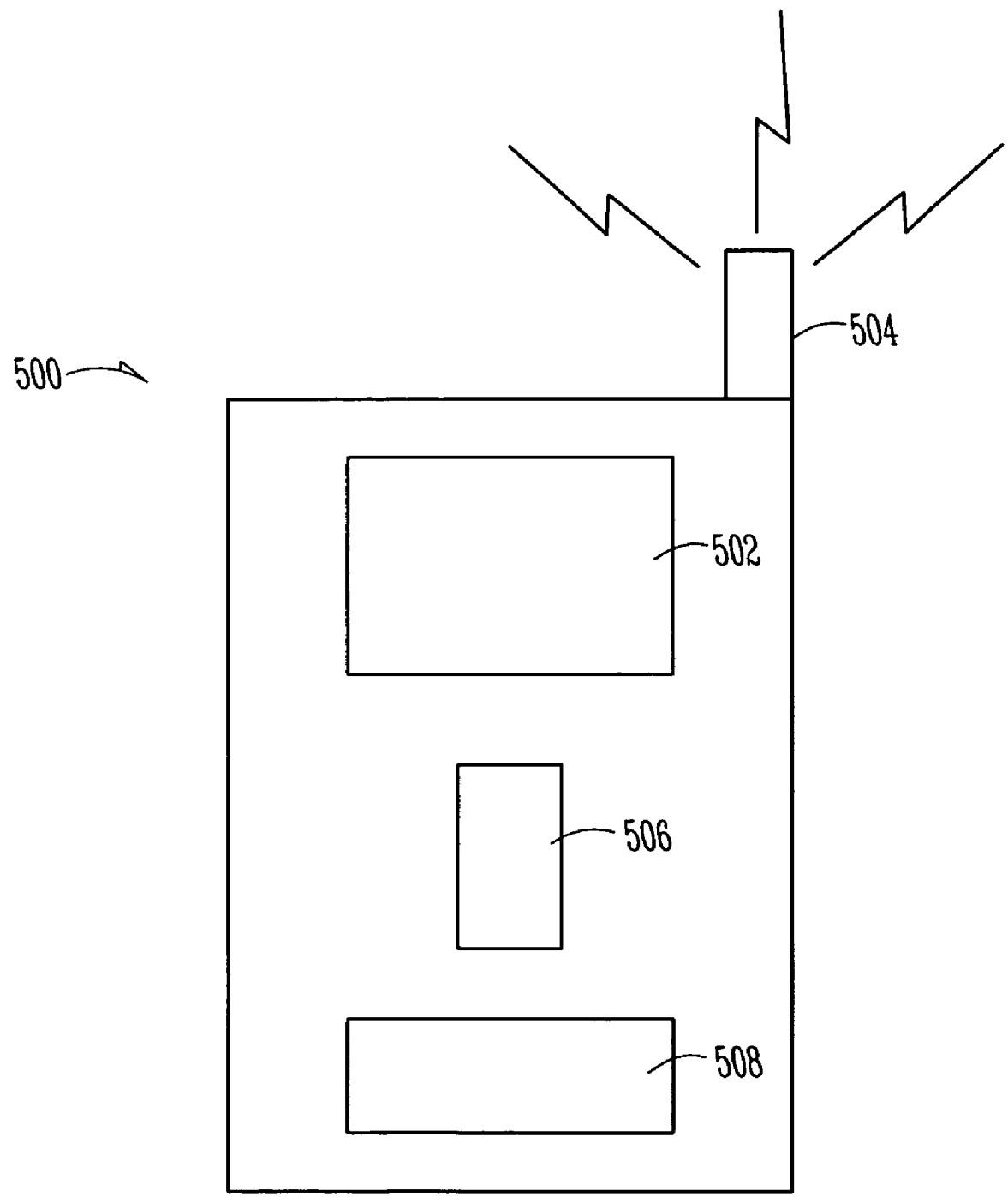
FIG. 5 is a block diagram according to an embodiment of the invention.

FIG. 5 is a block diagram according to one embodiment of the present invention. A wireless device 500 includes a display 502, an antenna 504, a processor 506, and a low-voltage flash memory device 508. The display 502 provides a user interface that can be navigated by a user to control the wireless device 500. The processor 506 processes data and controls provided by the user or a remote server (not shown). The low-voltage flash memory device 508 provides storage to store data and controls. In one embodiment, the low-voltage flash memory device 508 includes at least one embodiment of the invention as discussed hereinbefore. The wireless device 500 includes digital cameras, audio recorders, personal digital assistants, and test equipment. The low-voltage flash memory device 508 is used to store firmware, fonts, forms, data, faxes, digital audio clips, digital images, and so on.

CONCLUSION

Systems, devices, and methods have been discussed to enhance fuse circuits in integrated circuits, such as flash memory devices. One benefit of the fuse circuits of the embodiments of the invention is that the fuse is composed of a nonvolatile transistor. This economizes manufacturing of the integrated circuits because the integrated circuits are generally manufactured with millions of transistors already. Another benefit of the embodiments of the invention is that the fuse and the latch are not integrated; the fuse and the latch couple together for a desired duration so that the fuse can transfer its state onto the latch. Thereafter, the latch remembers and outputs the state of the fuse.

Although the specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

I claim:

1. A wireless device, comprising:
a display;
a processor coupled to the display; and
a flash memory device coupled to the processor, the flash memory device including a redundancy circuit having a fuse circuit, the fuse circuit includes:
an input stage that presents a gating signal;
a boosting stage that produces a boosting signal to boost the gating signal;
a transfer stage receptive to a transferring signal;
a latch receptive to data that is transferred by the transfer stage; and
a nonvolatile fuse that includes a flash cell having a gate, a drain, and a source, wherein the gate receives the gating signal, wherein the drain couples to the transfer stage, wherein the source couples to ground, and wherein the nonvolatile fuse is configured to operate with a voltage supply greater than approximately 1.65 volts.

2. A wireless device comprising:
a display;
a processor coupled to the display; and
a flash memory device coupled to the processor, the flash memory device comprising a fuse circuit, the fuse circuit comprising:
a volatile latch; and
a nonvolatile fuse to hold data, the nonvolatile fuse being adapted to operate with a voltage supply greater than about 1.65 volts, the voltage supply to be boosted to a predetermined level for a predetermined duration to enable the nonvolatile fuse to transfer the data to the volatile latch.

3. The wireless device of claim 2 wherein:
the wireless device further comprises an antenna;
the flash memory device was formed in an integrated circuit and further comprises:
an array of memory cells;
a decoder coupled to the array to decode address signals to select a memory cell in the array; and
a redundancy circuit coupled to the array to provide redundant memory elements for the array, the redundancy circuit including the fuse circuit;
the volatile latch comprises an output of a first inverter coupled to an input of a second inverter and an output of the second inverter coupled to an input of the first inverter;
the nonvolatile fuse comprises a flash cell having a threshold voltage of greater than about 2.5 volts and less than about 3.5 volts;
the voltage supply comprises a voltage supply in the range of 1.65 volts to 2.22 volts;
the voltage supply is to be boosted to about double the voltage supply by a boost circuit comprising a capacitor coupled to a gate of the flash cell; and
the boosted voltage is sufficient to turn on the flash cell if the flash cell is in an erased state and the boosted voltage is insufficient to turn on the flash cell if the flash cell is in a programmed state.

4. A wireless device comprising:
a display;
a processor coupled to the display; and
a flash memory device coupled to the processor, the flash memory device comprising a fuse circuit, the fuse circuit comprising:
an input stage to produce a gating signal;
a latch; and a nonvolatile fuse to hold data, the nonvolatile fuse having a first connection coupled to receive the gating signal, a second connection, and a third connection, the gating signal to be boosted to enable the nonvolatile fuse to selectively transfer the data to the latch, the non-volatile fuse being configured to operate with a voltage supply greater than approximately 1.65 volts.

5. The wireless device of claim 4 wherein:
the wireless device further comprises an antenna;
the flash memory device was formed in an integrated circuit and further comprises:
an array of memory cells;
a decoder coupled to the array to decode address signals to select a memory cell in the array; and
a redundancy circuit coupled to the array to provide redundant memory elements for the array, the redundancy circuit including the fuse circuit;
the nonvolatile fuse comprises a flash cell comprising a gate coupled to receive the gating signal, a drain, and a source coupled to ground, the flash cell having a threshold voltage of greater than about 2.5 volts and less than about 3.5 volts;
the input stage comprises:
a transistor comprising a gate, a drain, and a source, the gate of the transistor being coupled to receive a voltage supply in the range of 1.65 volts to 2.22 volts, the drain of the transistor being coupled to receive an enabling signal, and the source of the transistor being coupled to the gate of the flash cell to present the gating signal; and
an inverter having an input coupled to receive the enabling signal and an output coupled to the transistor; and
the boosted gating signal is to be boosted from the voltage supply, the boosted gating signal being sufficient to turn on the flash cell if the flash cell is in an erased state and the boosted gating signal being insufficient to turn on the flash cell if the flash cell is in a programmed state.

6. A wireless device comprising:
a display;
a processor coupled to the display; and
a flash memory device coupled to the processor, the flash memory device comprising a fuse circuit, the fuse circuit comprising:
an input stage to present a gating signal;
a boosting stage coupled to the input stage to boost the gating signal in response to a boosting signal;
a latch and
a nonvolatile fuse to hold data, the nonvolatile fuse having a first connection coupled to the input stage to receive the gating signal, a second connection, and a third connection, the gating signal to be boosted to enable the nonvolatile fuse to selectively transfer the data to the latch, wherein the non-volatile fuse is configured to operate with a voltage supply greater than approximately 1.65 volts.

7. The wireless device of claim 6 wherein:
the wireless device further comprises an antenna;
the flash memory device was formed in an integrated circuit and further comprises:
an array of memory cells;
a decoder coupled to the array to decode address signals to select a memory cell in the array; and
a redundancy circuit coupled to the array to provide redundant memory elements for the array, the redundancy circuit including the fuse circuit;

the nonvolatile fuse comprises a flash-cell comprising a gate coupled to receive the gating signal, a drain, and a source coupled to ground, the boosted gating signal being sufficient to turn on the flash cell if the flash cell is in an erased state and the boosted gating signal being insufficient to turn on the flash cell if the flash cell is in a programmed state;
the input stage comprises an inverter coupled in series with a transistor that is coupled to the gate of the flash cell, the inverter being coupled to receive an enabling signal, the transistor to generate the gating signal in response to the enabling signal;
the boosting stage comprises:
an inverter having an input coupled to receive a transferring signal and an output to generate the boosting signal;
a capacitor having a first connection coupled to the output of the inverter to receive the boosting signal and a second connection coupled to the gate of the flash cell to boost the gating signal, the capacitor to store a first level of energy based on a voltage supply in the range of 1.65 volts to 2.22 volts when the boosting signal is low and the gating signal is high and to boost the first level of energy to a second level of energy when the boosting signal is high and the gating signal is high.

8. A wireless device comprising:
a display;
a processor coupled to the display; and
a flash memory device coupled to the processor, the flash memory device comprising a fuse circuit, the fuse circuit comprising:
an input stage to present a gating signal;
a boosting stage coupled to the input stage to boost the gating signal in response to a boosting signal;
a latch
a transferring stage coupled to receive a transferring signal, the transferring stage to transfer data to the latch; and
a nonvolatile fuse to hold the data, the nonvolatile fuse having a first connection coupled to the input stage and the boosting stage to receive the gating signal, a second connection, and a third connection, the gating signal to be boosted to enable the nonvolatile fuse to transfer the data to the transferring stage, wherein the non-volatile fuse is configured to operate with a voltage supply greater than approximately 1.65 volts.

9. The wireless device of claim 8 wherein:
the wireless device further comprises an antenna;
the flash memory device was formed in an integrated circuit and further comprises:
an array of memory cells;
a decoder coupled to the array to decode address signals to select a memory cell in the array; and
a redundancy circuit coupled to the array to provide redundant memory elements for the array, the redundancy circuit including the fuse circuit;
the nonvolatile fuse comprises a flash cell comprising a gate coupled to the input stage to receive the gating signal, a drain, and a source coupled to ground, the boosted gating signal being sufficient to turn on the flash cell if the flash cell is in an erased state and the boosted gating signal being insufficient to turn on the flash cell if the flash cell is in a programmed state;
the input stage comprises an inverter coupled in series with a transistor that is coupled to the gate of the flash cell, the inverter being coupled to receive an enabling signal, the transistor to generate the gating signal in response to the enabling signal;
the transferring stage comprises:
an inverter having an input coupled to receive a transferring signal and an output to generate a switching signal in response to the transferring signal;
a p-channel transistor having a gate coupled to receive the switching signal, a source coupled to receive a voltage supply in the range of 1.65 volts to 2.22 volts, and a drain; and
an n-channel transistor having a gate coupled to receive the switching signal, a drain coupled to the drain of the p-channel transistor, and a source coupled to the drain of the flash cell; and
the boosting stage comprises a capacitor coupled between the gate of the flash cell and a boosting signal to boost the gating signal on the gate of the flash cell from the voltage supply in response to the boosting signal.

10. A wireless device comprising:
a display;
a processor coupled to the display; and
a flash memory device coupled to the processor, the flash memory device comprising a fuse circuit, the fuse circuit comprising:
an input stage to present a gating signal;
a boosting stage to boost the gating signal;
a transferring stage coupled to receive a transferring signal;
a latch coupled to receive data to be transferred by the transferring stage; and
a flash cell to hold the data, the flash cell comprising a gate coupled to the input stage to receive the gating signal, a drain coupled to the transferring stage, and a source coupled to ground, the flash cell having a threshold voltage between approximately 2.5 volts and approximately 3.5 volts.

11. The wireless device of claim 10 wherein:
the wireless device further comprises an antenna;
the flash memory device was formed in an integrated circuit and further comprises:
an array of memory cells;
a decoder coupled to the array to decode address signals to select a memory cell in the array; and
a redundancy circuit coupled to the array to provide redundant memory elements for the array, the redundancy circuit including the fuse circuit;
the input stage comprises an inverter coupled in series with a transistor that is coupled to the gate of the flash cell, the inverter being coupled to receive an enabling signal, the transistor to generate the gating signal in response to the enabling signal;
the transferring stage comprises a p-channel transistor coupled between a voltage supply in the range of 1.65 volts to 2.22 volts and the latch, and an n-channel transistor coupled between the latch and the drain of the flash cell, a gate of the p-channel transistor being coupled to a gate of the n-channel transistor to receive the transferring signal, the p-channel transistor to couple the latch to the voltage supply in response to a low transferring signal and the n-channel transistor to couple the latch to the drain of the flash cell to transfer the data in response to a high transferring signal;
the boosting stage comprises a capacitor coupled between the gate of the flash cell and a boosting signal to boost the gating signal on the gate of the flash cell from a first level of energy based on the voltage supply to a second level of energy in response to a high boosting signal;
the latch comprises an output of a first inverter coupled to an input of a second inverter and the transferring stage and an output of the second inverter coupled to an input of the first inverter; and
the flash cell is enabled to transfer the data to the transferring stage and the latch when the gating signal is at the second level of energy, the flash cell being turned on by the second level of energy if the flash cell is erased and the flash cell not being turned on by the second level of energy if the flash cell is programmed.

12. A wireless device comprising:
a display;
a processor coupled to the display; and
a flash memory device coupled to the processor, the flash memory device comprising a fuse circuit, the fuse circuit comprising:
a volatile latch circuit to latch data;
a nonvolatile fuse to hold the data that is configured to operate with a voltage supply that is greater than approximately 1.65 volts; and
a boost circuit to boost a gating signal on the nonvolatile fuse to enable the nonvolatile fuse to transfer the data.

13. The wireless device of claim 12 wherein:
the wireless device further comprises an antenna;
the flash memory device was formed in an integrated circuit and further comprises:
an array of memory cells;
a decoder coupled to the array to decode address signals to select a memory cell in the array; and
a redundancy circuit coupled to the array to provide redundant memory elements for the array, the redundancy circuit including the fuse circuit;
the nonvolatile fuse comprises a flash cell comprising a gate coupled to receive the gating signal, a drain, and a source coupled to ground, the boosted gating signal being boosted from a voltage supply in the range of 1.65 volts to 2.22 volts, the boosted gating signal being sufficient to turn on the flash cell if the flash cell is in an erased state and the boosted gating signal being insufficient to turn on the flash cell if the flash cell is in a programmed state;
the volatile latch comprises an output of a first inverter coupled to an input of a second inverter and the drain of the flash cell and an output of the second inverter coupled to an input of the first inverter;
the boost circuit comprises a capacitor coupled between the gate of the flash cell and a boosting signal to boost the gating signal on the gate of the flash cell in response to the boosting signal.

14. A wireless device comprising:
a display;
a processor coupled to the display; and
a flash memory device coupled to the processor, the flash memory device comprising a fuse circuit, the fuse circuit comprising:
a volatile latch circuit to latch data;
a flash cell to hold the data having a threshold voltage of at least approximately 2.5 volts; and
a boost circuit to boost a gating signal on the flash cell to enable the flash cell to transfer the data.

15. The wireless device of claim 14 wherein:
the wireless device further comprises an antenna;
the flash memory device was formed in an integrated circuit and further comprises:

an array of memory cells;
a decoder coupled to the array to decode address signals to select a memory cell in the array; and
a redundancy circuit coupled to the array to provide redundant memory elements for the array, the redundancy circuit including the fuse circuit;
the flash cell comprises a gate coupled to receive the gating signal, a drain, and a source coupled to ground, the boosted gating signal being sufficient to turn on the flash cell if the flash cell is in an erased state and the boosted gating signal being insufficient to turn on the flash cell if the flash cell is in a programmed state;
the volatile latch comprises an output of a first inverter coupled to an input of a second inverter and the drain of the flash cell and an output of the second inverter coupled to an input of the first inverter; and
the boost circuit comprises a capacitor coupled between the gate of the flash cell and a boosting signal to boost the gating signal on the gate of the flash cell from a voltage supply in the range of 1.65 volts to 2.22 volts in response to the boosting signal.

16. A wireless device comprising:
a processor; and
a flash memory device coupled to the processor, the flash memory having a fuse circuit, the fuse circuit including:
a latch to latch data; and
a nonvolatile fuse to hold the data, the nonvolatile fuse configured to receive a selectively boosted gating signal and configured to operate with a voltage supply greater than approximately 1.65 volts.

17. The wireless device of claim 16, wherein the nonvolatile fuse includes a flash cell having threshold voltage ranging from about 2.5 volts to about 3.5 volts.

18. The wireless device of claim 16, wherein the nonvolatile fuse includes a flash cell that transfers the data when the nonvolatile fuse is in an erased state.

19. The wireless device of claim 16, wherein the fuse circuit includes a boosting stage to capacitively couple a transfer signal to a gating control of the nonvolatile fuse.

20. The wireless device of claim 16, wherein the fuse circuit includes a pre-charging stage to boost a gating signal received at an input to the fuse circuit to provide the gating signal without distortion to a gating control of the nonvolatile fuse.

21. The wireless device of claim 1, wherein the wireless device includes a voltage supply ranging from about 1.65 volts to about 2.2 volts to operate the flash memory device.

22. The wireless device of claim 1, wherein the flash memory device is configured to store user information.

23. The wireless device of claim 2, wherein the nonvolatile fuse includes a flash cell configured to transfer the data when the nonvolatile fuse is in an erased state.

24. The wireless device of claim 2, wherein the fuse circuit includes a boosting stage to capacitively couple a transfer signal to a gating control of the nonvolatile fuse.

25. The wireless device of claim 2, wherein the fuse circuit includes a pre-charging stage to boost a gating signal received at an input to the fuse circuit to provide the gating signal without distortion to a gating control of the nonvolatile fuse.

26. The wireless device of claim 4, wherein the nonvolatile fuse includes a flash cell configured to transfer the data when the nonvolatile fuse is in an erased state.

27. The wireless device of claim 4, wherein the fuse circuit includes a transfer stage to selectively transfer the data from the nonvolatile fuse to the latch.

28. The wireless device of claim 4, wherein the fuse circuit includes a pre-charging stage to boost the gating signal received at an input to the fuse circuit to provide the gating signal without distortion to a gating control of the nonvolatile fuse.

29. The wireless device of claim 6, wherein the nonvolatile fuse includes a flash cell having a threshold voltage between about 2.5 volts and about 3.5 volts, the flash cell configured to transfer the data when the nonvolatile fuse is in an erased state.

30. The wireless device of claim 6, wherein the fuse circuit includes a transfer stage to selectively transfer the data from the nonvolatile fuse to a latch.

31. The wireless device of claim 6, wherein the fuse circuit includes a pre-charging stage to boost the gating signal to provide the gating signal without distortion to a gating control of the nonvolatile fuse.

32. The wireless device of claim 6, wherein the wireless device includes a voltage supply ranging from about 1.65 volts to about 2.2 volts to operate the flash memory device.

33. The wireless device of claim 8, wherein the nonvolatile fuse includes a flash cell having a threshold voltage between about 2.5 volts and about 3.5 volts.

34. The wireless device of claim 8, wherein the fuse circuit includes a pre-charging stage to boost the gating signal to provide the gating signal without distortion to a gating control of the nonvolatile fuse.

35. The wireless device of claim 8, wherein the wireless device includes a voltage supply ranging from about 1.65 volts to about 2.2 volts to operate the flash memory device.

36. The wireless device of claim 10, wherein the wireless device includes a voltage supply ranging from about 1.65 volts to about 2.2 volts to operate the flash memory device.

37. The wireless device of claim 10, wherein the wireless device is a personal digital assistant.

38. The wireless device of claim 10, wherein the fuse circuit includes a pre-charging stage to boost the gating signal to provide the gating signal without distortion to a gating control of the nonvolatile fuse.

39. The wireless device of claim 10, wherein the flash memory device is configured to store user information.

40. The wireless device of claim 12, wherein the wireless device includes a voltage supply ranging from about 1.65 volts to about 2.2 volts to operate the flash memory device.

41. The wireless device of claim 12, wherein the nonvolatile fuse includes a flash cell having a threshold voltage between about 2.5 volts and about 3.5 volts, the flash cell configured to transfer the data to the latch when the nonvolatile fuse is in an erased state.

42. The wireless device of claim 12, wherein the fuse circuit includes a pre-charging stage to boost the gating signal to provide the gating signal without distortion to a gating control of the nonvolatile fuse.

43. The wireless device of claim 12, wherein the flash memory device is a wireless phone.

44. The wireless device of claim 14, wherein the wireless device includes a voltage supply ranging from about 1.65 volts to about 2.2 volts to operate the flash memory device.

45. The wireless device of claim 14, wherein the nonvolatile fuse includes a flash cell having a threshold voltage between about 2.5 volts and about 3.5 volts, the flash cell configured to transfer the data to the latch when the nonvolatile fuse is in an erased state.

46. The wireless device of claim 14, wherein the flash memory device is configured to store user information.

47. The wireless device of claim 14, wherein the flash memory device is a wireless phone.

* * * * *

UNITED STATES PATENT AND TRADEMARK OFFICE
CERTIFICATE OF CORRECTION

PATENT NO. : 7,209,403 B2  Page 1 of 1
APPLICATION NO. : 10/716766
DATED : April 24, 2007
INVENTOR(S) : Santin It is certified that error appears in the above-identified patent and that said Letters Patent is hereby corrected as shown below:

In column 3, line 12, delete "maybe" and insert -- may be --, therefor.

In column 9, line 16, delete "310" and insert -- I310 --, therefor.

In column 11, line 49, in Claim 6, after "latch" insert -- ; --.

In column 12, line 1, in Claim 7, delete "flash-cell" and insert -- flash cell --, therefor.

In column 12, line 36, in Claim 8, after "latch" insert -- ; --.

Signed and Sealed this

Twenty-fourth Day of July, 2007

JON W. DUDAS
*Director of the United States Patent and Trademark Office*